United States Patent [19]
Boyle et al.

[11] Patent Number: 4,525,640
[45] Date of Patent: Jun. 25, 1985

[54] HIGH PERFORMANCE AND GATE HAVING AN "NATURAL" OR ZERO THRESHOLD TRANSISTOR FOR PROVIDING A FASTER RISE TIME FOR THE OUTPUT

[75] Inventors: David H. Boyle; Daniel J. Kouba, both of Manassas, Va.

[73] Assignee: IBM Corporation Armonk, N.Y.

[21] Appl. No.: 481,033

[22] Filed: Mar. 31, 1983

[51] Int. Cl.³ ............... H03K 19/017; H03K 19/094; H03K 17/04; H03K 17/693

[52] U.S. Cl. ................................ 307/450; 307/482; 307/578; 307/584; 307/270

[58] Field of Search ............... 307/450, 451, 446, 448, 307/571, 577, 578, 581, 583, 584, 270, 482

[56] References Cited

U.S. PATENT DOCUMENTS

| | | | |
|---|---|---|---|
| 3,995,172 | 11/1976 | Freeman et al. | 307/450 X |
| 4,276,487 | 6/1981 | Arzubi et al. | 307/482 X |
| 4,289,973 | 9/1981 | Eaton, Jr. | 307/482 X |
| 4,296,339 | 10/1981 | Murotani | 307/450 |
| 4,381,460 | 4/1983 | Menachem | 307/578 X |

FOREIGN PATENT DOCUMENTS 2266  1/1977  Japan ..................... 307/450

Primary Examiner—Stanley D. Miller
Assistant Examiner—David R. Bertelson
Attorney, Agent, or Firm—John E. Hoel

[57] ABSTRACT

A "natural" threshold device is serially connected between the gate of an output depletion mode FET device and the input node to an FET device so as to provide current flow from the input node to the gate of the FET device as the input waveform begins to rise, and yet to provide sufficient resistance in the gate circuit of the depletion mode device so as to prevent backward flow of current from the gate as the potential of the output node rises. This increases the conductivity of the output load device, thereby providing a faster rise time for the output waveform.

3 Claims, 3 Drawing Figures

4,525,640

HIGH PERFORMANCE AND GATE HAVING AN "NATURAL" OR ZERO THRESHOLD TRANSISTOR FOR PROVIDING A FASTER RISE TIME FOR THE OUTPUT

FIELD OF THE INVENTION

The invention disclosed broadly relates to semiconductor circuits and more particularly relates to field effect transistor circuits.

BACKGROUND OF THE INVENTION

In the conventional push/pull AND driver of FIG. 1 consisting of the FET devices 1' to 8', the gate of the output depletion mode FET device 6' is connected through a self-biased depletion mode load device 8' to the drain potential VD in what is effectively a shorted connection to drain potential. Thus, as the output node for the circuit rises, there is no chance for any bootstrapping effect to take place through the gate-to-source capacitance, since the gate potential for the output device 6' cannot rise above the drain potential. This limits the rise time for output waveforms from the driver circuit.

OBJECTS OF THE INVENTION

It is therefore an object of the invention to achieve a faster time for an output waveform from an FET driver circuit.

SUMMARY OF THE INVENTION

These and other objects, features and advantages of the invention are accomplished by the high performance AND gate circuit disclosed herein. A "natural" threshold device is serially connected between the gate of an output, low threshold FET load device and an input node to the circuit so as to provide current flow from the input node to the gate of the FET load device as the input waveform begins to rise, and yet to provide sufficient resistance in the gate circuit of the low threshold device so as to prevent backward flow of current from the gate of the FET load device as the potential of the output node rises. This increases the conductivity of the output load device, thereby providing a faster rise time for the output waveform.

DISCUSSION OF THE PREFERRED EMBODIMENT

A "natural" threshold device is serially connected between the gate of an output FET load device and the input node to the circuit so as to provide current flow from the input node to the gate of the FET load device as the input waveform begins to rise, and yet to provide sufficient resistance in the gate circuit of the FET load device so as to prevent backward flow of current from the gate thereof as the potential of the output node rises. This increases the conductivity of the output load device, thereby providing a faster rise time for the output waveform.

Figure 1:
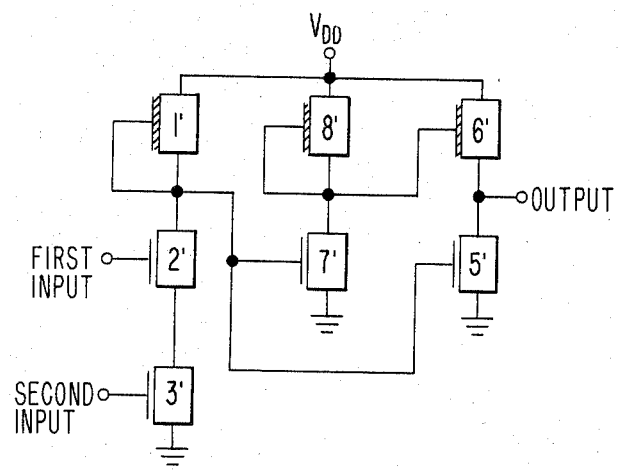
FIG. 1 illustrates a prior art FET driver circuit.

In the conventional push/pull AND driver of FIG. 1, the gate of device 6' which is the output depletion mode FET device, is connected through the self-biased depletion mode load device 8' to the drain potential VDD in what is effectively a short connection to VDD. Thus, as the output node for the circuit rises, there is no chance for a bootstrapping effect to take place through the gate-to-source capacitance, since the gate potential for the output device 6' cannot rise above the VDD potential.

Figure 2:
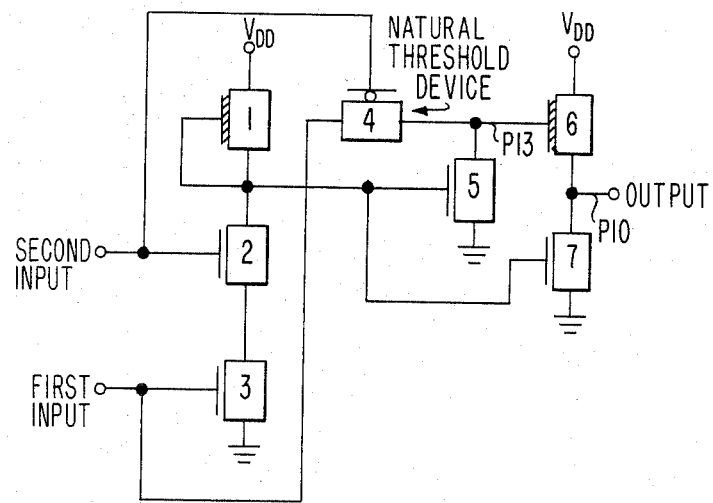
FIG. 2 illustrates the improved high performance AND gate driver circuit in accordance with the invention, and includes an active impedance device 5.
Figure 3:
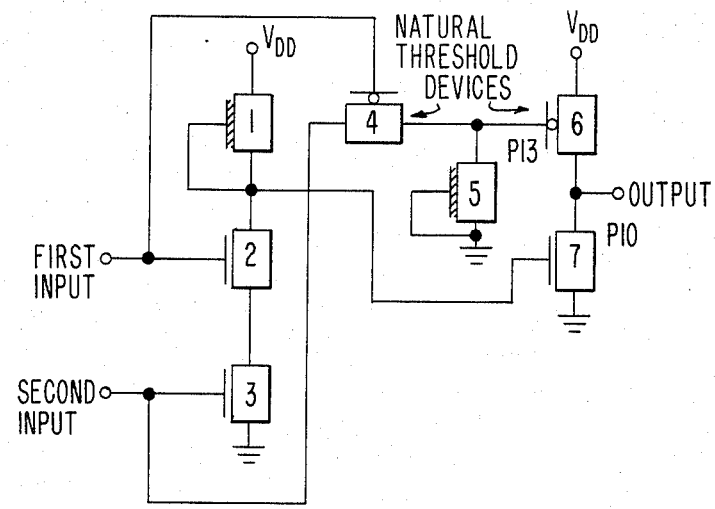
FIG. 3 illustrates a second embodiment of the invention, and includes a diode-type impedance device 5.

In contrast, the zero threshold voltage "natural" FET device 4 in the AND driver invention of FIGS. 2 and 3, presents a certain amount of resistive impedance which is serially connected between the gate of the output FET load device 6 and the input node to the circuit at FET device 3. When the input node to the FET device 3 undergoes a positive transition and the input node to the FET device 2 undergoes a positive transition, both the source and the gate of the natural device 4 are at the same potential and the device 4 will be in its on state so that current will flow from the input node to the FET device 3 through the natural device 4 to the node P13 at the gate of the FET device 6.

Thereafter, as the output node P10 of the circuit rises, the gate-to-source capacitance of the FET device 6 couples the rise in the potential at the output node to the node P13 which is the gate of the FET device 6. Since there is some resistance in the series connected natural FET device 4, although a charge will start to slowly flow from the node P13 through the FET device 4, it will not flow out fast enough to avoid the bootstrapping effect wherein the potential at the gate of the FET device 6 rises above the value of VDD due to the capacitive coupling of the gate of the FET device 6 to its source.

As an example, when VDD equals 4.5 volts and the input voltages at the FET devices 2 and 3 is 4 volts, an on state bootstrapped voltage at the node P13 achieves 5.47 volts. This forces the load device 6 into a strong on-state, thereby providing a greater quantity of current to the output node P10. As a result, the AND driver invention of FIGS. 2 and 3 will drive a capacitive load at the output node of the circuit with a faster rise time than is available with the more conventional push/pull circuit of FIG. 1.

The AND gate driver circuit of FIGS. 2 and 3 comprises a NAND block 1, 2 and 3 having a first and second input terminals and an output node, for providing a NAND logic function voltage at the output thereof in response to the voltages applied to the input terminals. An output circuit including the enhancement node FET device 7 is connected between the circuit output node and ground potential, having its gate connected to the output node of the NAND block. The low threshold voltage FET device 6 is connected between the circuit output node and the drain potential, having its gate connected through an impedance 5 to the ground potential. The substantially zero threshold voltage FET device 4 has its source/drain path connected between the gate of the low threshold voltage FET device 6 and a first one of the circuit inputs, and also has its gate connected to a second one of the circuit inputs. The zero threshold device 4 conducts current between the first one of the circuit inputs and the gate of the low threshold FET device when the potential of the first input begins to rise, and the zero threshold device 4 impedes current flow between the gate of the low threshold FET device and the first one of the circuit inputs when the voltage at the circuit output node rises. Therefore the rise time of the voltage at the circuit output node is reduced.

The resultant AND driver circuit will drive a capacitive load at the output node with a faster rise time than is available with conventional bootstrap circuits. Analysis shows the circuit to be approximately 10 percent faster with 24 percent less power dissipation. Physical layouts of the circuit indicate that it will occupy 5 percent less active area than the conventional driver circuits, such as is shown in FIG. 1.

The second embodiment of the invention is shown in FIG. 3. The difference between the embodiments in FIGS. 2 and 3 lies in the FET device 5. In the embodiment shown in FIG. 3, the FET device 5 is a self-biased depletion mode load device which serves as a diode-type impedance between the bootstrap node and the ground potential and serves to bleed charge from node P13. In the embodiment shown in FIG. 2, the FET device 5 is an enhancement mode FET device whose gate is connected to the output node of the first stage, so as to serve as an active impedance between the bootstrap node and ground potential. In both embodiments, device 5 serves to bleed charge from node P13 during intervals when the output P10 is going low. The active impedance embodiment of FIG. 2 is faster in that it provides a quicker on-state rise time because more positive charge remains at the gate of device 6, since device 5 is turned off when the output P10 is going high.

Although specific embodiments of the invention have been disclosed, it will be understood by those of skill in the art that the foregoing and other changes in form and details may be made therein without departing from the spirit and the scope of the invention.

Having thus described our invention, what we claim as new, and desire to secure by Letters Patent is:

1. An AND gate driver circuit comprising:

a NAND block having a first and second input terminals and an output node, for providing a NAND logic function voltage at said output thereof in response to the voltages applied to said input terminals;

an output circuit including an enhancement mode FET device connected between a circuit output node and ground potential, having its gate connected to said output node of said NAND block;

a low threshold voltage FET device connected between said circuit output node and a drain potential, having its gate connected through an impedance means to said ground potential;

a substantially zero threshold voltage FET device having its source/drain path connected between said gate of said low threshold voltage FET device and a first one of said circuit inputs, and having its gate connected to a second one of said circuit inputs; said zero threshold device conducting current between said first one of said circuit inputs and said gate of said low threshold FET device when the potential of said first input begins to rise, and said zero threshold device impeding current flow between said gate of said low threshold FET device and said first one of said circuit inputs when the voltage at said circuit output node rises;

whereby the rise time of the voltage at said circuit output node is reduced.

2. The circuit of claim 1, wherein said low voltage FET device has a substantially zero threshold voltage and where said impedance means is self-biased depletion mode load device.

3. The circuit of claim 1, wherein said low voltage FET device is a depletion mode FET device and said impedance means is an enhancement mode FET device with its gate connected to said output node of said NAND block.

* * * * *